United States Patent
Rice et al.

(10) Patent No.: US 7,407,081 B2
(45) Date of Patent: Aug. 5, 2008

(54) METHODS AND APPARATUS FOR TRANSFERRING CONDUCTIVE PIECES DURING SEMICONDUCTOR DEVICE FABRICATION

(75) Inventors: Michael R. Rice, Pleasanton, CA (US); Claes H. Bjorkman, Los Altos, CA (US); Jun Zhao, Cupertino, CA (US); Kenneth S. Collins, San Jose, CA (US); Thomas Miu, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 94 days.

(21) Appl. No.: 11/095,943

(22) Filed: Mar. 31, 2005

(65) Prior Publication Data

US 2005/0232728 A1 Oct. 20, 2005

Related U.S. Application Data

(60) Provisional application No. 60/558,089, filed on Mar. 31, 2004.

(51) Int. Cl.
*B23K 1/00* (2006.01)
*B23Q 16/00* (2006.01)

(52) U.S. Cl. .................... 228/8; 228/11; 228/41

(58) Field of Classification Search .......... 228/19, 228/41
See application file for complete search history.

(56) References Cited

U.S. PATENT DOCUMENTS

| | | | | |
|---|---|---|---|---|
| 4,857,482 A | 8/1989 | Saito et al. | ............... | 29/837 |
| 5,217,597 A | 6/1993 | Moore et al. | ............... | 205/123 |
| 5,257,395 A * | 10/1993 | Li | ............... | 712/22 |
| 5,631,803 A * | 5/1997 | Cameron et al. | ............... | 361/234 |
| 5,765,744 A | 6/1998 | Tatumi et al. | ............... | 228/254 |
| 5,814,885 A * | 9/1998 | Pogge et al. | ............... | 257/730 |
| 5,839,641 A * | 11/1998 | Teng | ............... | 228/41 |
| 5,841,194 A * | 11/1998 | Tsukamoto | ............... | 257/729 |
| 6,056,190 A * | 5/2000 | Foulke et al. | ............... | 228/246 |
| 6,409,073 B1 | 6/2002 | Kaskoun et al. | ............... | 228/180.22 |
| 6,492,715 B1 * | 12/2002 | Markovich et al. | ............... | 257/678 |
| 6,696,347 B1 | 2/2004 | Hikita et al. | ............... | 438/406 |
| 6,889,886 B2 * | 5/2005 | Hazeyama et al. | ............... | 228/39 |
| 6,926,188 B2 * | 8/2005 | Hazeyama et al. | ............... | 228/41 |
| 2001/0045524 A1 | 11/2001 | Fudoji et al. | ............... | 250/491.1 |
| 2003/0106925 A1 | 6/2003 | Bednarz et al. | ............... | 228/245 |

FOREIGN PATENT DOCUMENTS

| | | |
|---|---|---|
| EP | 0 840 368 A2 | 5/1998 |
| JP | 01 045135 A | 2/1989 |
| JP | 05-047839 | 2/1993 |
| JP | 05 047839 A | 2/1993 |
| JP | 07-283521 | 10/1995 |
| JP | 07 283521 A | 10/1995 |

* cited by examiner

*Primary Examiner*—Kiley Stoner
(74) *Attorney, Agent, or Firm*—Dugan & Dugan

(57) ABSTRACT

In a first aspect, a programmable transfer device is provided for transferring conductive pieces to electrode pads of a target substrate. The programmable transfer device includes (1) a transfer substrate; and (2) a plurality of individually addressable electrodes formed on the transfer substrate. Each electrode is adapted to selectively attract and hold a conductive piece during transfer of the conductive piece to an electrode pad of a target substrate. Numerous other aspects are provided.

13 Claims, 12 Drawing Sheets

Optimization of Electrode Geometry: Thin Film Example

| Ball Density: 9.87 gram/cm³ | | | | |
|---|---|---|---|---|
| Film Thickness: 1um | | | | |
| Dielectric Constant: 4 | | | | |
| Bipolar Voltage: +/-20V | | | | |
| | Optimum Outer Electrode | | Optimum %Radius* | Ratio of |
| Ball Radius (um) | Outer Radius (um) | | Inner/Outer Electrode | ES Force/Ball Weight |
| 10 | 8.5 | | 40 | 750 |
| 15 | 12 | | 37 | 360 |
| 25 | 19 | | 32 | 140 |
| 50 | 32 | | 27 | 37 |
| 75 | 45 | | 25 | 17 |
| 100 | 60 | | 22 | 10 |
| 150 | 80 | | 20 | 4.5 |

*Assumes Negligible Inter-Electrode Radial Gap

FIG. 11

Optimization of Electrode Geometry: Thick Film Example

| Ball Density: 9.87 gram/cm³ | | | | |
|---|---|---|---|---|
| Film Thickness: 10um | | | | |
| Dielectric Constant: 4 | | | | |
| Bipolar Voltage: +/−200V | | | | |
| | Optimum Outer Electrode | | Optimum %Radius* | Ratio of |
| Ball Radius (um) | Outer Radius (um) | | Inner/Outer Electrode | ES Force/Ball Weight |
| 10 | 9.5 | | 60 | 3100 |
| 15 | 14.5 | | 57 | 1700 |
| 25 | 24 | | 53 | 800 |
| 50 | 46 | | 47 | 260 |
| 75 | 64 | | 43 | 125 |
| 100 | 85 | | 40 | 75 |
| 150 | 123 | | 35 | 37 |

*Assumes Negligible Inter-Electrode Radial Gap

FIG. 12

METHODS AND APPARATUS FOR TRANSFERRING CONDUCTIVE PIECES DURING SEMICONDUCTOR DEVICE FABRICATION

The present application claim priority to U.S. Provisional Patent Application Ser. No. 60/558,089, filed Mar. 31, 2004 and titled "METHODS AND APPARATUS FOR TRANSFERRING CONDUCTIVE PIECES DURING SEMICONDUCTOR DEVICE FABRICATION", which is hereby incorporated by reference herein in its entirety.

FIELD OF THE INVENTION

The present invention relates to semiconductor device manufacturing, and more particularly to methods and apparatus for transferring conductive pieces during semiconductor device fabrication.

BACKGROUND OF THE INVENTION

During device packaging, electrical connections must be formed between semiconductor device electrode pads of a substrate die and package lead frames. One technique for forming such electrical connections is to employ a Flip Chip process.

During a typical Flip Chip process, conductive bumps are provided at electrode pads of a substrate die, and the substrate die is attached to a circuit board or other carrier face down. The conductive bumps form electrical and mechanical connections between the substrate die and the carrier. Various reflow and/or underfill processes may be employed to secure the substrate die to the underlying carrier and protect the electrical connections provided by the conductive bumps.

Flip Chip bumps may be formed at electrode pads of a substrate using many techniques such as masked physical vapor deposition, electrochemical or electroless plating, paste printing or the like. Another technique for forming bumps at electrode pads of a substrate is to pre-form micron size solder balls and to transfer the pre-formed solder balls to the electrode pads. E. Hashino et al., "Micro-Ball Wafer Bumping for Flip Chip Interconnection," IEEE Electronic Components and Technology Conference (2001) describe such a technique in which pre-formed solder balls are transferred to electrode pads via an arrangement plate. As described by E. Hashino et al., the arrangement plate includes a plurality of vacuum holes, each adapted to vacuum-hold one solder ball, arranged in a pattern that matches the pattern of electrode pads to which the solder balls are to be transferred. Ideally, such an approach allows all solder balls required for a substrate to be transferred to the electrode pads of the substrate in one transfer operation.

Vacuum-based arrangement plates suffer from several drawbacks. For example, a unique arrangement plate typically must be employed for each electrode pad pattern. Also, during transfer of solder balls to the arrangement plate, improper solder ball registration may occur at one or more vacuum holes of the arrangement plate due to vacuum leaks, contamination, moisture, etc. To affect transfer of solder balls from the arrangement plate to electrode pads of a substrate, an adhesive agent such as solder flux typically must be employed at each electrode pad so that solder balls remain at the electrode pads when the arrangement plate is removed. Flux-free processing thereby is precluded. Accordingly, improved methods and apparatus for transferring conductive materials, such as solder balls, are desirable.

SUMMARY OF THE INVENTION

In a first aspect of the invention, a programmable transfer device is provided for transferring conductive pieces to electrode pads of a target substrate. The programmable transfer device includes (1) a transfer substrate; and (2) a plurality of individually addressable electrodes formed on the transfer substrate. Each electrode is adapted to selectively attract and hold a conductive piece during transfer of the conductive piece to an electrode pad of a target substrate.

In a second aspect of the invention, a transfer device is provided for transferring conductive pieces to target locations of a target substrate. The transfer device includes (1) a transfer substrate; and (2) a plurality of electrodes formed on the transfer substrate. Each electrode is adapted to selectively attract and hold a conductive piece during transfer of the conductive piece to a target location of a target substrate.

In a third aspect of the invention, a method is provided for transferring conductive pieces to target locations of a target substrate. The method includes the steps of (1) holding conductive pieces with electrodes of a transfer substrate; (2) aligning the held conductive pieces with the target locations of the target substrate; and (3) transferring the conductive pieces from the transfer substrate to the target locations of the target substrate.

In a fourth aspect of the invention, a method is provided for transferring conductive pieces to electrode pads of a target substrate. The method includes the steps of (1) determining an electrode pad pattern of the target substrate; (2) selecting electrodes of a transfer substrate to address based on the electrode pad pattern of the target substrate; (3) holding conductive pieces with the selected electrodes of the transfer substrate; (4) aligning the held conductive pieces with the electrode pads of the target substrate; and (5) transferring the conductive pieces from the transfer substrate to the electrode pads of the target substrate. Numerous other aspects are provided in accordance with these and other aspects of the invention.

Other features and aspects of the present invention will become more fully apparent from the following detailed description, the appended claims and the accompanying drawings.

BRIEF DESCRIPTION OF THE DRAWINGS

FIG. 11 is a table of an optimized bipolar electrode geometry for a dielectric layer thickness of 1 micron.

FIG. 12 is a table of an optimized bipolar electrode geometry for a dielectric layer thickness of 10 microns.

DETAILED DESCRIPTION

Figure 1:
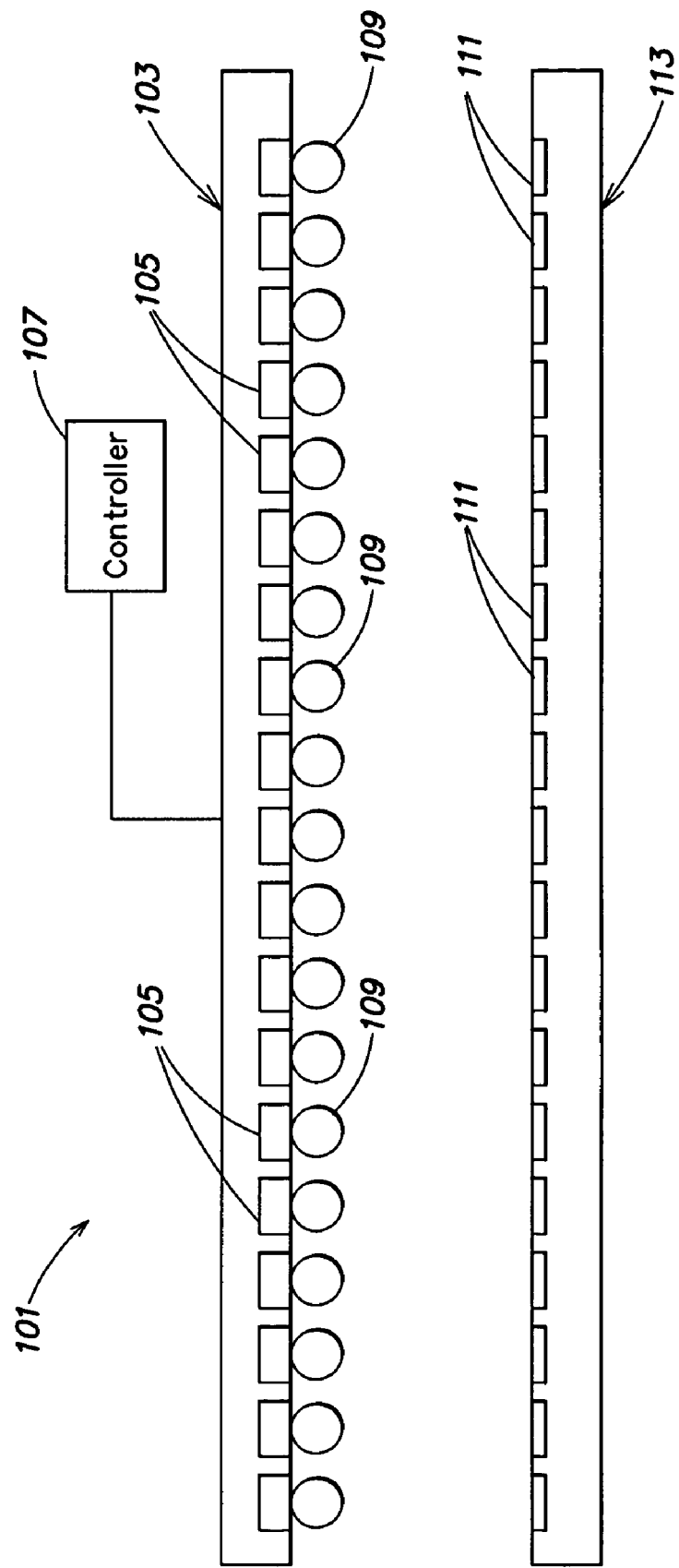
FIG. 1 is a schematic illustration of a conductive piece transfer apparatus provided in accordance with the present invention.

FIG. 1 is a schematic illustration of a conductive piece transfer apparatus 101 provided in accordance with the present invention. The conductive piece transfer apparatus 101 includes a transfer substrate 103 having a plurality electrodes 105 formed therein coupled to a controller 107. As will described further below, the electrodes 105 of the transfer substrate 103 are adapted to electrostatically hold conductive pieces, such as solder balls 109, solder cubes, solder cylinders or other similar materials or shapes, during transfer of the conductive pieces to electrode pads 111 of semiconductor devices (not separately shown) formed on a semiconductor wafer, glass plate, polymer substrate or similar device substrate 113. The transfer substrate 103 also may be employed to transfer conductive pieces to a printed circuit board or other carrier, as well as to individual substrate die.

The transfer substrate 103 may be fabricated on any suitable substrate such as a semiconductor wafer, glass plate or the like using conventional semiconductor device manufacturing processes (e.g., lithography, deposition, etching, etc.). Exemplary embodiments of the transfer substrate 103 are described below with reference to FIGS. 2-6.

The controller 107 may be implemented in hardware, software or a combination thereof. For example, the controller 107 may include one or more microprocessors or microcontrollers operative with computer program code for performing one or more steps of any of the processes described herein. All or a portion of the controller 107 may be remote from the transfer substrate 103 (as shown) or may be included as part of the transfer substrate 103 (e.g., fabricated on the transfer substrate 103).

Exemplary Embodiments of the Transfer Substrate

As stated above, the transfer substrate 103 includes a plurality of electrodes 105 that are adapted to electrostatically hold conductive pieces during transfer of the conductive pieces to electrode pads of a device substrate or other carrier which is to receive the conductive pieces (hereinafter the "target substrate"). The transfer substrate 103 preferably is the same size or larger than the target substrate, and may include a sufficient number of electrodes 105 to allow simultaneous transfer of all conductive pieces that are to be transferred to the target substrate. If die level transfer of conductive pieces is to be performed, a smaller sized transfer substrate may be employed (e.g., preferably a transfer substrate that includes a sufficient number of electrodes 105 to allow simultaneous transfer of all conductive pieces that are to be transferred to the target die or dies).

In one embodiment of the invention, the transfer substrate 103 may be suitable only for use with one type of target substrate. For example, the transfer substrate may have (1) a number of electrodes 105 that matches a number of electrode pads 111 of a target substrate; and (2) an electrode pattern layout that matches an electrode pad pattern layout of the target substrate. In general, such a transfer substrate 103 is usable only with target substrates having the same number and/or layout of electrode pads. In an alternative embodiment of the invention, a number of electrodes 105 of the transfer substrate 103 exceeds a number of electrode pads 111 of the target substrate, and appropriate electrodes 105 of the transfer substrate 103 may be individually addressed (e.g., energized) so as to hold conductive pieces only in locations that align with electrode pads 111 of the target substrate (as described further below). Such a transfer substrate 103 is customizable, and may be used with target substrates having varying numbers and/or layouts of electrode pads.

As stated previously, the transfer substrate 103 may be fabricated on any suitable substrate such as a semiconductor wafer, glass plate or the like using conventional semiconductor device manufacturing processes (e.g., lithography, deposition, etching, etc.). In at least one embodiment of the invention, the transfer substrate 103 is fabricated using the same substrate material as the target substrate. For example, if the target substrate comprises a silicon wafer, the transfer substrate 103 may be fabricated using a silicon wafer. Likewise, if the target substrate is a glass plate (e.g., for a flat panel display), the transfer substrate 103 may be fabricated using a glass plate. By using the same or a similar material for the target substrate and the transfer substrate 103, thermal expansion issues relating to differences in the coefficients of thermal expansion of the target and transfer substrates may be reduced and/or eliminated.

Figure 2:
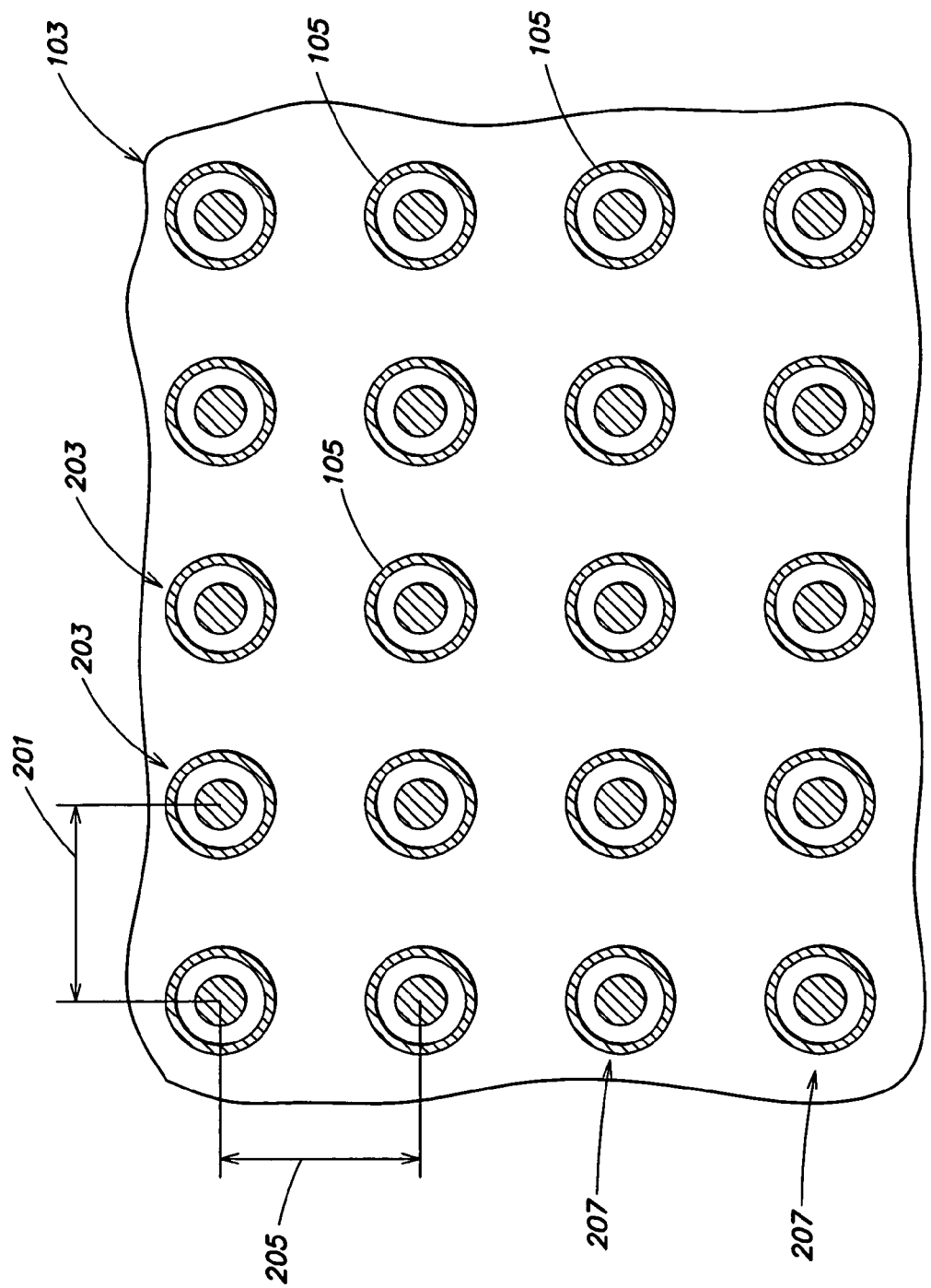
FIG. 2 is a top plan view of a portion of the transfer substrate of FIG. 1 illustrating a first exemplary layout for the plurality of electrodes of the transfer substrate.

FIG. 2 is a top plan view of a portion of the transfer substrate 103 of FIG. 1 illustrating a first exemplary layout for the plurality of the electrodes 105 of the transfer substrate 103. With reference to FIG. 2, the electrodes 105 of the transfer substrate 103 are arranged in a grid pattern in which a pitch or center-to-center distance 201 between columns 203 of electrodes 105 is approximately equal to a pitch 205 of rows 207 of electrodes 105. It will be understood that, in general, the pitches 201, 205 may differ. In one particular embodiment of the invention, the pitches 201, 205 may range from about 50 to 200 microns, although other spacings may be employed.

Figure 3:
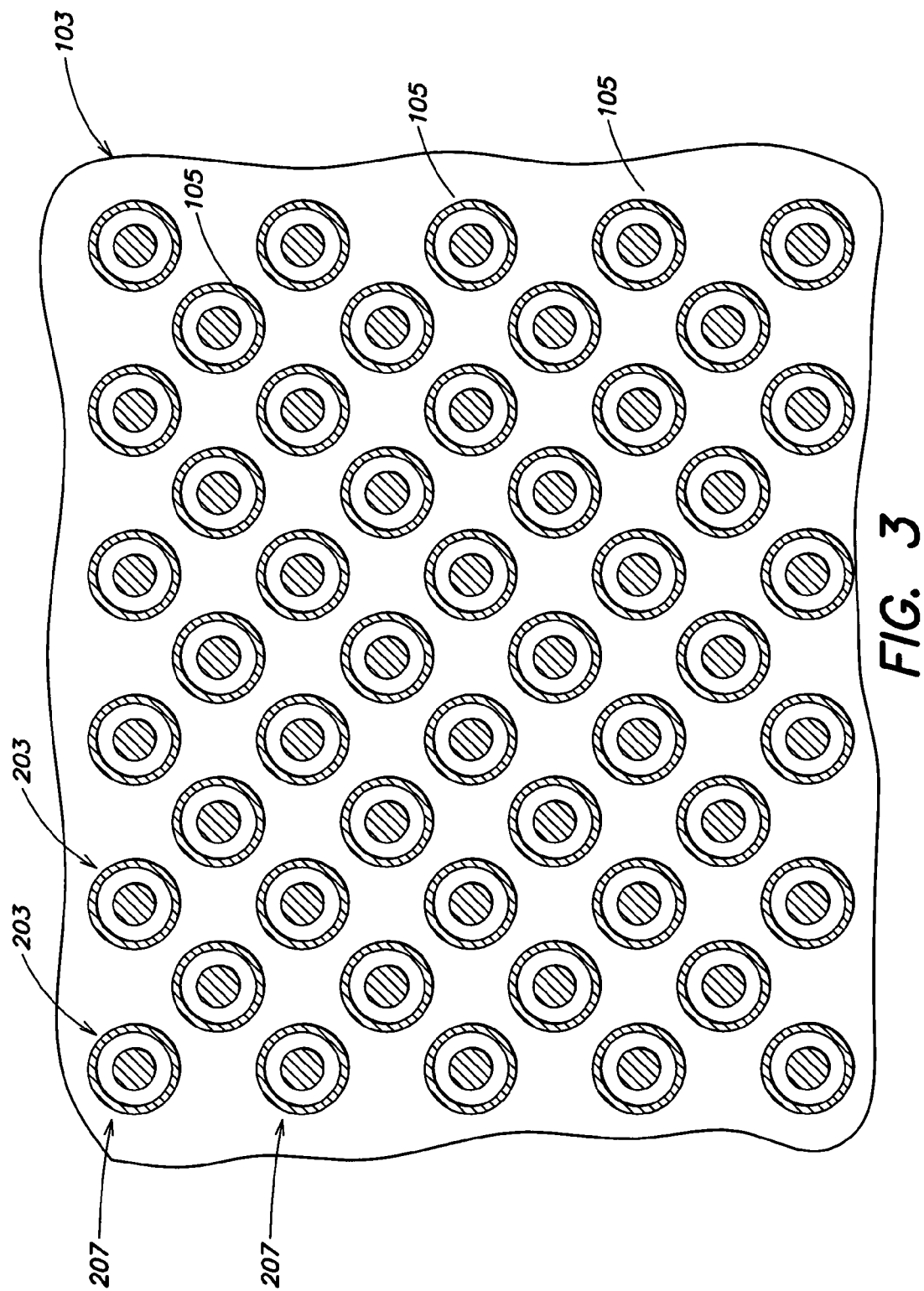
FIG. 3 is a top plan view of a portion of the transfer substrate of FIG. 1 illustrating a second exemplary layout for the plurality of electrodes of the transfer substrate.

FIG. 3 is a top plan view of a portion of the transfer substrate 103 of FIG. 1 illustrating a second exemplary layout for the plurality of the electrodes 105 of the transfer substrate 103. The second exemplary layout of FIG. 3 is similar to the first exemplary layout of FIG. 2, but employs a tighter electrode packing density. For example, in the second exemplary layout of FIG. 3, the pitch between diagonal electrodes is less than the pitch between columns 203 or rows 207 of electrodes. Other electrode arrangements may be employed.

Figure 4C:
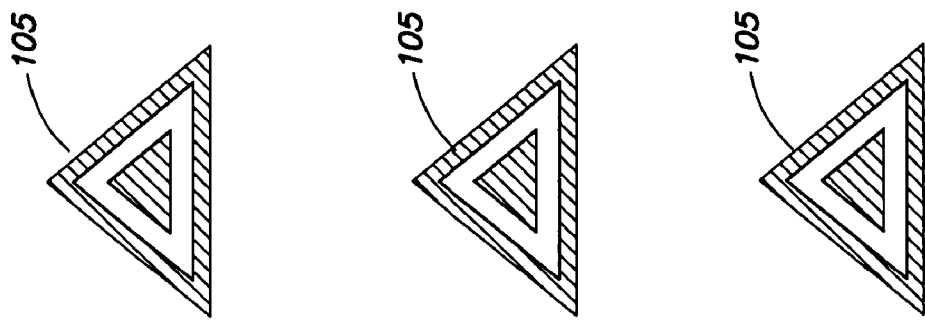
FIGS. 4B and 4C illustrate columns of rectangularly-shaped and triangularly-shaped electrodes, respectively, that may be employed by the transfer substrate of FIG. 1.
Figure 4B:
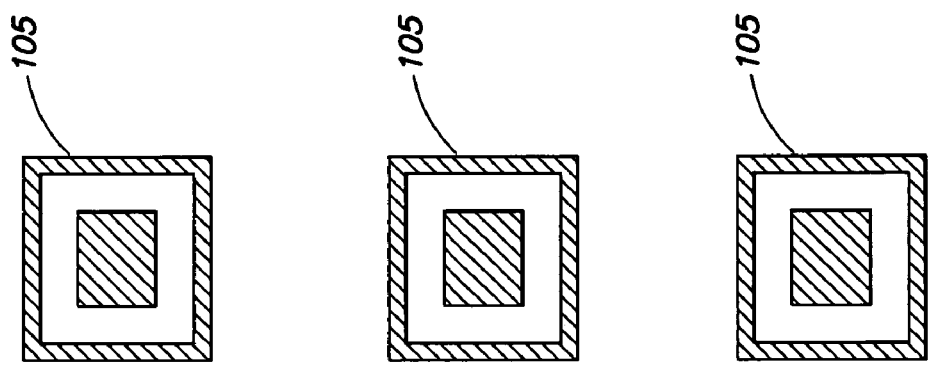
Figure 4A:
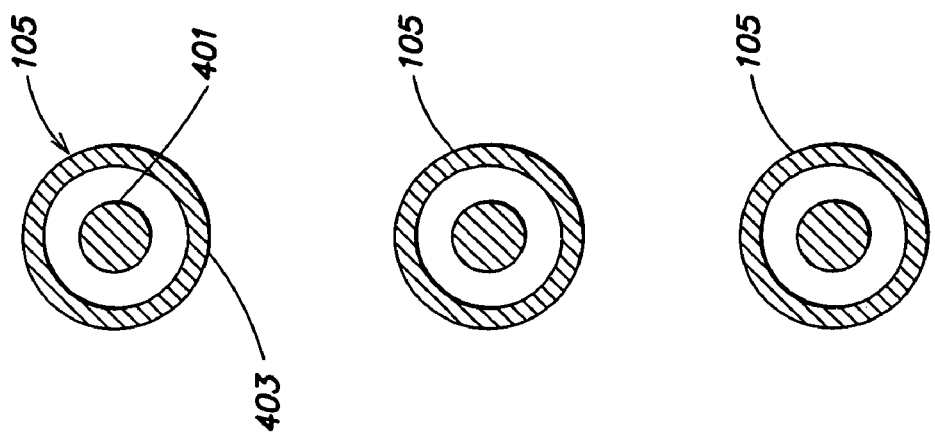
FIG. 4A illustrates an enlarged view of a column of electrodes useful in describing the operation of bipolar electrodes.

The electrodes 105 of FIGS. 2 and 3 are illustrated as being circularly-shaped, bipolar electrodes. FIG. 4A illustrates an enlarged view of a column of the electrodes 105 useful in describing the operation of such bipolar electrodes. FIGS. 4B and 4C illustrate columns of rectangularly-shaped and triangularly-shaped electrodes, respectively, that also may be employed by the transfer substrate 103. In general, any other electrode shape, or a combination of electrode shapes, may be used for the electrodes 105 of the transfer substrate 103.

With reference to FIG. 4A, each electrode 105 includes an inner electrode 401 and an outer electrode 403 which form the bipolar electrode 105. By applying an AC or DC bias across the inner and outer electrodes 401, 403, an electric field is created between the inner and outer electrodes 401, 403. The electric field may couple through a conductive piece, such as one of the solder balls 109 of FIG. 1, when the conductive piece is positioned proximate the electrode 105. The electric field causes charge within the conductive piece to redistribute to balance the electric potential on the electrode 105. Specifically, charge having a polarity opposite to that of the inner and outer electrodes 401, 403 is accumulated within the conductive piece (across a dielectric layer 501 as described below with reference to FIGS. 5A and 5B), causing the conductive piece to be attracted to and held by the electrode 105. Note that it may be preferable to neutralize the conductive pieces before the conductive pieces are picked up and/or held by the electrodes 105 (e.g., to avoid electrical damage to the devices on the target substrate to which the conductive pieces are to be transferred). Such neutralization may be performed by grounding the container that holds the conductive pieces prior to transfer, by neutralizing the environment (e.g., air or other gas) in which the conductive pieces are stored (e.g., using an ionizer or the like), etc.

Figure 5A:
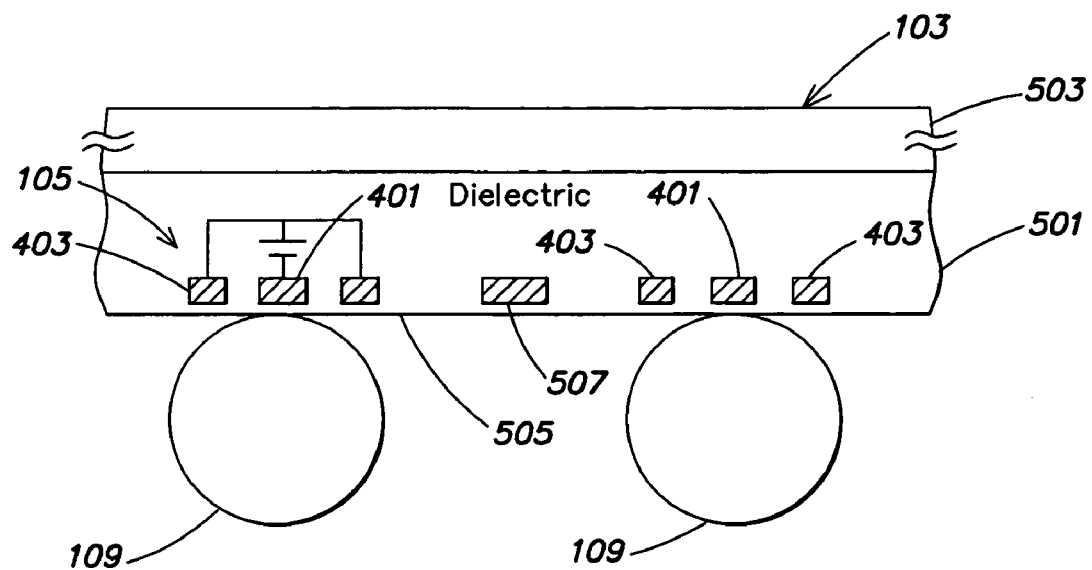
FIG. 5A is a side cross-sectional view of a portion of the transfer substrate of FIG. 1 illustrating two electrodes positioned within a dielectric layer formed on a substrate.

FIG. 5A is a side cross-sectional view of a portion of the transfer substrate 103 illustrating two electrodes 105 positioned within a dielectric layer 501 formed on a substrate 503 (e.g., a silicon wafer, a glass plate, etc.). The dielectric layer 501 may comprise silicon dioxide ($SiO_2$), silicon nitride ($Si_3N_4$), aluminum oxide ($Al_2O_3$), $SiO_x$, $Si_xN_y$, SiHN, AlN, etc., for example, or another suitable electrically insulating material.

As shown in FIG. 5A, the dielectric layer 501 surrounds and electrically isolates the inner and outer electrode 401, 403 of each electrode 105. The dielectric layer 501 also forms a contact surface 505 against which conductive pieces such as the solder balls 109 are held by the electrodes 105. The dielectric material may be selected, for example, based on its dielectric constant (e.g., which affects chucking force) and/or the wettability of the conductive pieces to be held against the dielectric layer 501 (e.g., if a conductive piece is to be molten while in contact with the dielectric layer 501, the dielectric layer 501 preferably is selected such that the conductive piece will not be unintentionally held by or otherwise unintentionally stick to the dielectric layer 501 while in a molten state). A ground plane 507 may be formed between adjacent electrodes 105 to prevent electric fields from cross coupling between the electrodes.

In at least one embodiment of the invention, the dielectric layer 501 may have a thickness of about 0.5 to 10 microns between the contact surface 505 and the inner and outer electrodes 401, 403, each outer electrode 403 of an electrode 105 may have a diameter and/or length that is about the same or less than that of the conductive piece to be held by the electrode, and/or the inner and outer electrodes 401, 403 of an electrode 105 may be spaced from each other by about 0.5 to 10 microns. The ground plane 507 preferably is at the same depth as the inner and outer electrodes 401, 403 and may be spaced from an outer electrode 403 by a distance of about 10 microns. Other dielectric layer thicknesses, electrode sizes and/or spacings, and/or ground plane depths and/or distances may be employed. An exemplary embodiment of the transfer substrate 103 is described below with reference to FIG. 8.

Figure 5B:
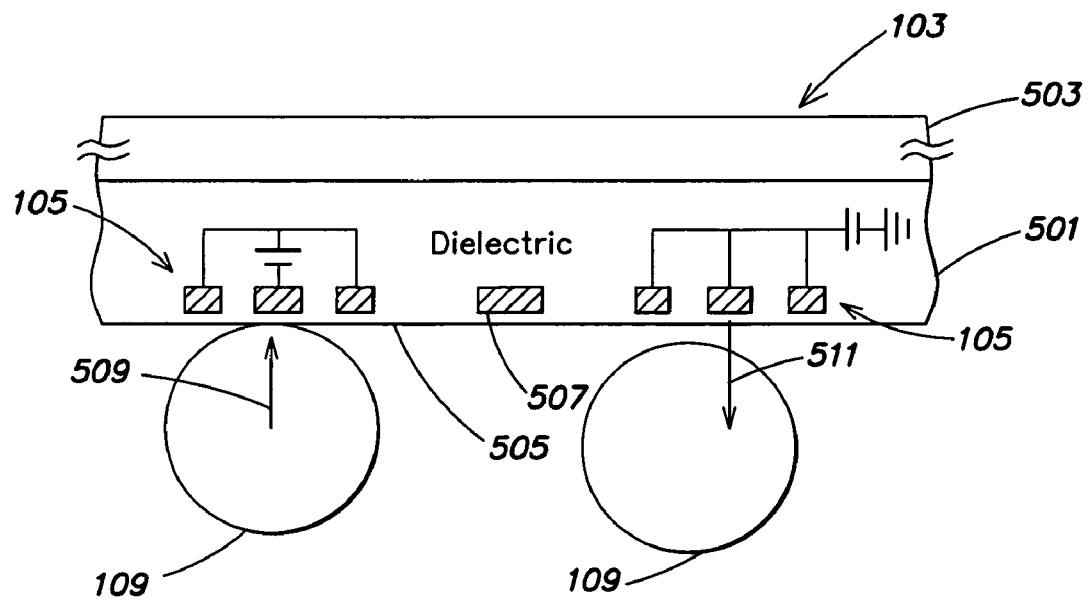
FIG. 5B is a side cross-sectional view similar to that of FIG. 5A, which illustrates the electrostatic force that holds a solder ball against a contact surface of the transfer substrate of FIG. 1.

Referring to the left-most electrode 105 in FIG. 5A, a DC bias is applied across the inner and outer electrodes 401, 403, generating an electric field (not shown) between the two electrodes 401, 403. (As stated, an AC voltage similarly may be employed.) The electric field couples through the dielectric layer 501 and causes charge within the solder ball 109 to be redistributed. The solder ball 109 thereby is held by the electrode 105 as described previously. FIG. 5B is a side cross-sectional view similar to that of FIG. 5A, which illustrates the electrostatic force 509 that holds the solder ball 109 against the contact surface 505 of the transfer substrate 103.

The voltage levels required to hold the solder ball 109 or another conductive piece against the contact surface 505 of the transfer substrate 103 depend on many factors such as solder ball/conductive piece size, shape, weight, conductivity and/or polarity, geometry and/or spacing of the inner and outer electrodes 401, 403, the dielectric constant and/or dielectric breakdown voltage of the dielectric layer 501, the distance between the inner and outer electrodes 401, 403 and the contact surface 505 and the like. In at least one embodiment, an AC voltage of about 10-500 volts may be applied between the inner and outer electrodes 401, 403 to hold a 50 to 200 micron diameter solder ball or other shaped conductive piece against the contact surface 505. Other voltage levels may be used. Note that the use of AC voltages may reduce dielectric charging and increase the lifetime of the transfer substrate 103.

Referring to the right-most electrode 105 in FIG. 5A, no bias is applied between the inner and outer electrodes 401, 403 of the electrode 105. Accordingly, the solder ball 109 generally will not be held against the contact surface 505 of the electrode 105. In some circumstances, however, an unwanted electrostatic charge may accumulate on the electrode 105 and/or the solder ball 109 that causes the solder ball 109 to be loosely and/or undesirably held against the contact surface 505.

To remove a solder ball 109 that is being undesirably held against the contact surface 505 of the transfer substrate 103, the inner and outer electrodes 401, 403 may be AC or DC biased with the same voltage (and voltage polarity) as shown by the right-most electrode 105 in FIG. 5B. By applying the same voltage and voltage polarity to the inner and outer electrodes 401, 403, the electrode 105 behaves as a monopole electrode. By then cycling the applied voltage polarity between positive and negative, a like charge will be generated between the solder ball 109 and the electrode 105 during at least a portion of the voltage polarity cycling. This like charge will push the solder ball 109 away from the contact surface 505 as shown by arrow 511 in FIG. 5B. The electrode voltage levels required to remove solder balls from the contact surface 505 depend on numerous factors (such as the factors described previously with regard to the voltage levels required to hold a solder ball against the contact surface 505). In one embodiment, a DC voltage of about 20 volts may be simultaneously applied to both the inner and outer electrodes 401, 403 of an electrode 105 to remove a solder ball being (unintentionally or otherwise) held against the contact surface 505 of the transfer substrate 103. Other voltage levels and/or positive, negative or both polarities (e.g., relative to ground) may be used.

While the electrodes 105 described with reference to FIGS. 2-5B have been bipolar electrodes, it will be understood that monopolar electrodes similarly may be employed by the transfer substrate 103. When monopolar electrodes are employed, conductive pieces such as the solder balls 109 typically must be referenced to a potential (e.g., ground) to be properly held by the electrodes 105 of the transfer substrate 103. For example, solder balls or other conductive pieces may be placed in an ionizer, gas discharge or other plasma, a voltage-referenced liquid or other medium, etc., to reference the solder balls or other conductive pieces to a potential.

In one or more embodiments of the invention, each electrode 105 of the transfer substrate 103 may be individually addressed (e.g., energized). Such an arrangement allows the transfer substrate 103 to be customized to match the electrode pad patterns of multiple target substrates. For example, by selectively employing electrodes 105, differing "active" electrode pitches may be achieved. That is, a generic array of electrodes 105 may be formed on the transfer substrate 103 at a pre-determined pitch; and only addressed or enabled electrodes 105 of the transfer substrate 103 will hold solder balls 109 or other conductive pieces during a transfer operation. The same transfer substrate 103 thereby may be employed for an unlimited number of target substrates have varying electrode pad patterns and/or pitches. In one embodiment, such a generic array of electrodes 105 may have an electrode pitch of between about 150 to 250 microns. Other pitches may be employed.

Figure 6:
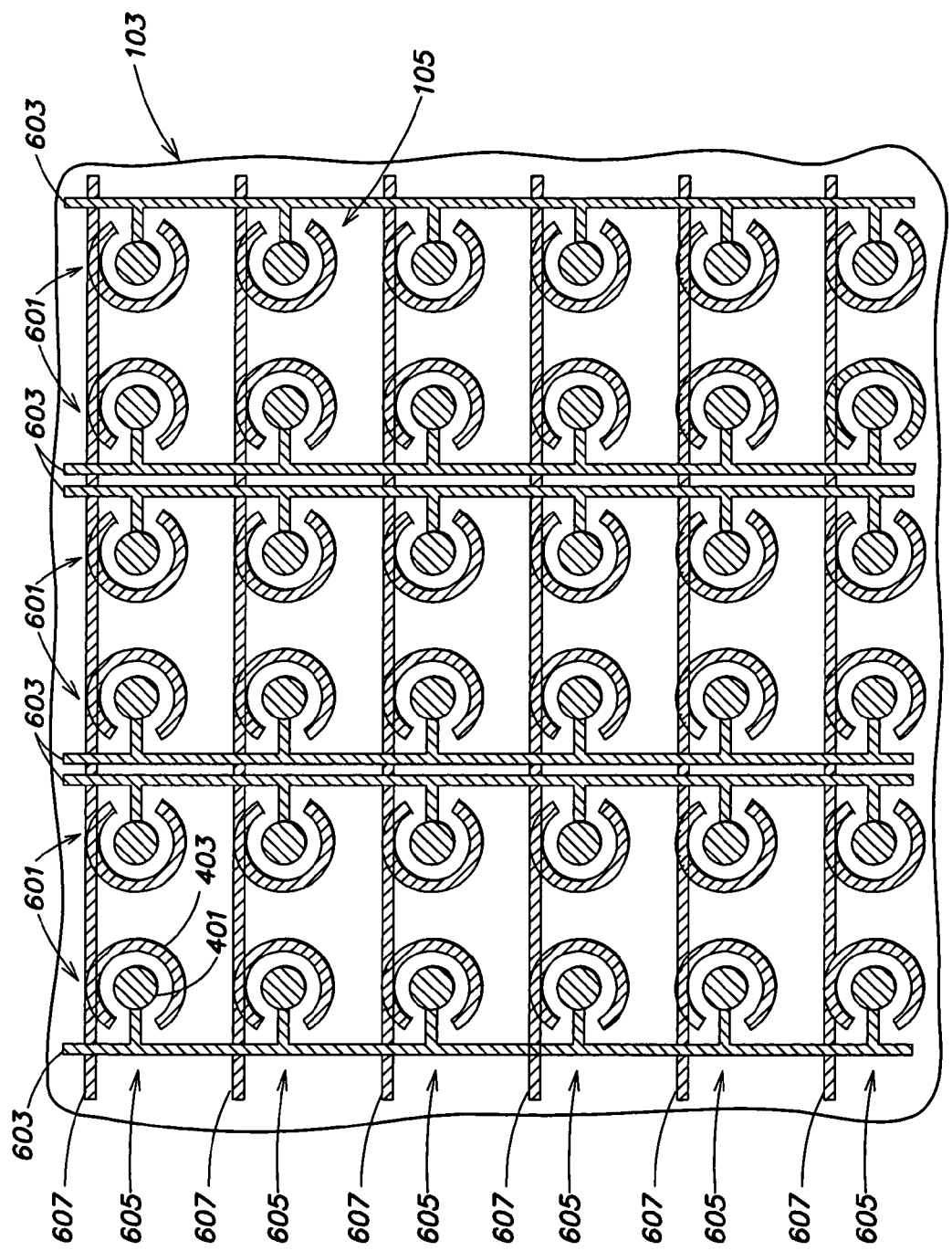
FIG. 6 is a top plan view of a portion of an exemplary embodiment of the transfer substrate of FIG. 1 illustrating a multiplexing approach for addressing each electrode of the transfer substrate.

To provide separate addressing for each electrode 105, each electrode 105 may be wired individually. Alternatively, a multiplexing approach may be employed for addressing each electrode 105. FIG. 6 is a top plan view of a portion of an exemplary embodiment of the transfer substrate 103 illustrating a multiplexing approach for addressing each electrode 105.

With reference to FIG. 6, inner electrodes 401 of columns 601 of electrodes 105 are coupled via column connections 603, and outer electrodes 403 of rows 605 of electrodes 105 are coupled via row connections 607. (Column connections 603 may reside in a first plane that is electrically isolated from a second plane in which row connections 607 reside). Such addressing is similar to the addressing techniques employed in DRAMS or similar memory devices, and allows each electrode 105 to be individually activated (e.g., by storing charge in a capacitor at each electrode location) through a unique column connection 603 and row connection 607 combination. Other addressing schemes may be employed.

Exemplary Transfer Process

Figure 7:
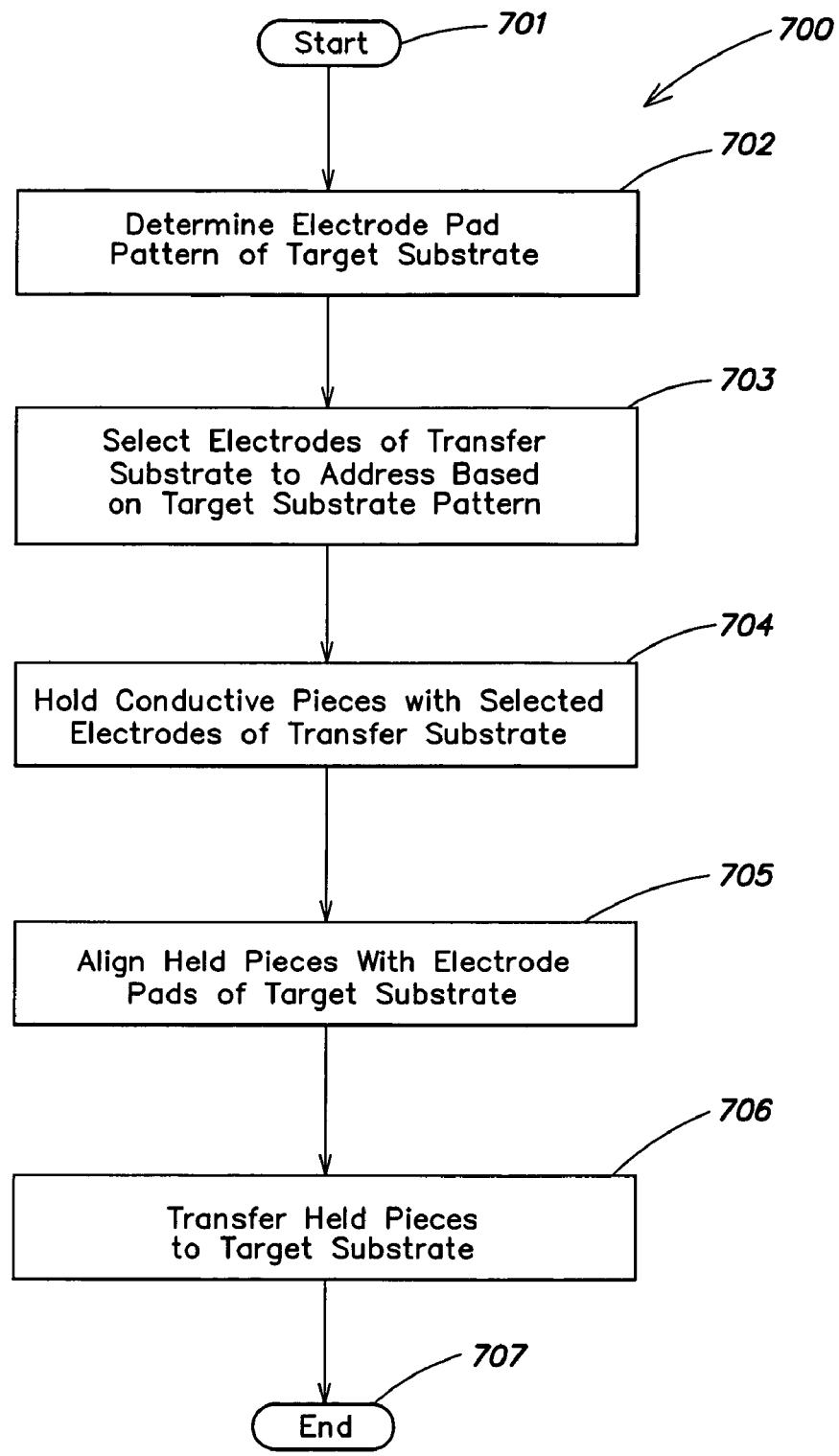
FIG. 7 is a flowchart of an exemplary process for transferring conductive pieces to a target substrate in accordance with the present invention.

FIG. 7 is a flowchart of an exemplary process 700 for transferring conductive pieces to a target substrate in accordance with the present invention. One or more of the steps of the process 700 may be performed by the controller 107 of FIG. 1 and/or may comprise one or more computer program products.

With reference to FIG. 7, the process 700 begins at step 701. In step 702, the electrode pad pattern of the target substrate (e.g., substrate 113 in FIG. 1) to which conductive pieces are to be transferred is determined. For example, the electrode pad pattern of the target substrate may be known. Alternatively, the target substrate may be examined to determine the location of electrode pads on the target substrate. Optical, x-ray or similar metrology may be employed to identify the locations of electrode pads on the target substrate. Electrode pad spacings may be standardized such that the pad patterns of target substrates are easily recognized by a video, charge-coupled device (CCD) or other camera and pattern recognition software. Electrode pad pattern information then may be fed to the controller 107 (FIG. 1). In at least one embodiment, such electrode pad pattern information may be employed to customize the transfer substrate 103 in approximately real time (e.g., on-the-fly customization) as described further below.

In step 703, the controller 107 determines which electrodes 105 of the transfer substrate 103 to address/energize based on the pattern of electrode pads on the target substrate. For example, based on the pattern of electrode pads on the target substrate, the controller 107 may determine the row and column of each electrode 105 to address during a conductive piece transfer operation.

In step 704, the transfer substrate 103 is employed to hold conductive pieces with the electrodes 105 of the transfer substrate 103 that correspond to the electrode pads of the target substrate (e.g., using the electrodes 105 selected in step 703). To hold the conductive pieces, the transfer substrate 103 may be brought proximate a plurality of the conductive pieces that are to be held by the transfer substrate 103. For example, the transfer substrate 103 may be oriented so that the electrodes 105 of the transfer substrate 103 face upward, and conductive pieces may be poured or otherwise placed on the contact surface 505 of the transfer substrate 103. The selected electrodes 105 of the transfer substrate 103 then may be addressed/energized so that conductive pieces are electrostatically held by the addressed/energized electrodes. The transfer substrate 103 may be tilted or flipped so that conductive pieces not being held by the transfer substrate 103 are removed (e.g., via gravity). In general, the transfer substrate 103 may be held at any angle to receive conductive pieces that are to be transferred to the target substrate.

To ensure that conductive pieces are not unintentionally held by the unaddressed electrodes 105 of the transfer substrate 103, an identical voltage level and polarity may be applied to the inner and outer electrodes 401, 403 of unaddressed electrodes. The voltage polarity then may be cycled and/or swept between a positive and negative polarity to repel any unintentionally held conductive pieces (as described previously). Nitrogen or a similar gas also may be employed to blow unintentionally held conductive pieces from the transfer substrate 103. Mechanical agitation/forces (e.g., shaking and/or vibrating) may be similarly employed.

An optical or similar inspection step may be performed to ensure that all and/or only electrodes 105 of the transfer substrate 103 intended to hold conductive pieces are holding conductive pieces. If conductive pieces were not properly transferred to the transfer substrate 103, the above process may be repeated until conductive pieces are held at each selected electrode 105 of the transfer substrate 103 and not at unselected electrodes of the transfer substrate. The same or a different location and/or chamber in which the conductive pieces were initially introduced to the transfer substrate 103 may be employed.

In step 705, the transfer substrate 103 is positioned proximate the target substrate and the conductive pieces held by the transfer substrate 103 are aligned with the electrode pads of the target substrate. For example, the electrodes 105 of the transfer substrate 103 may be aligned to the electrode pads of the target substrate via transmission of an optical wavelength through both substrates (e.g., an optical wavelength at which the transfer and target substrates are transparent, such as an infrared wavelength for silicon substrates). Registration marks, alignment features or other conventional lithographic alignment techniques also may be employed.

Once the conductive pieces held by the transfer substrate 103 are aligned with the electrode pads of the target substrate, in step 706 the conductive pieces held by the transfer substrate 103 are transferred to the electrode pads of the target substrate. To perform such a transfer, the voltage applied to the energized electrodes 105 of the target substrate may be removed, grounded or swept to an opposite polarity. The target substrate also may be held at a temperature, in an ambient environment and/or at a voltage potential that facilitates the transfer of the conductive pieces from the transfer substrate 103 to the electrode pads of the target substrate. For example, the transfer substrate 103 may be heated to a temperature that increase the adhesive properties of the conductive pieces held by the transfer substrate 103 to electrode pads of the target substrate. In embodiments in which the contact surface 505 of the transfer substrate 103 is a dielectric, conductive pieces held by the transfer substrate 103 are less like to stick to the contact surface 505 when heated (e.g., melted) than to the electrode pads of a target substrate.

To increase the stickiness of the target substrate, a flux layer or other sticky material may be disposed on the electrode pads of the target substrate. If the conductive pieces being held by the transfer substrate 103 are transferred in a non-oxidizing environment, such a flux layer may be undesirable and/or eliminated. A voltage also may be applied to the target substrate and/or electrode pads of the target substrate that attracts the conductive pieces. The conductive pieces may be transferred while in a solid or molten phase.

Topographical features, such as valleys and ridges, saw tooth patterns, etc., may be added to the contact surface 505 of the transfer substrate 103 to further reduce sticking of conductive pieces to the transfer substrate 103 during the transfer operation of step 706.

In step 707, the process 700 ends.

Figure 8:
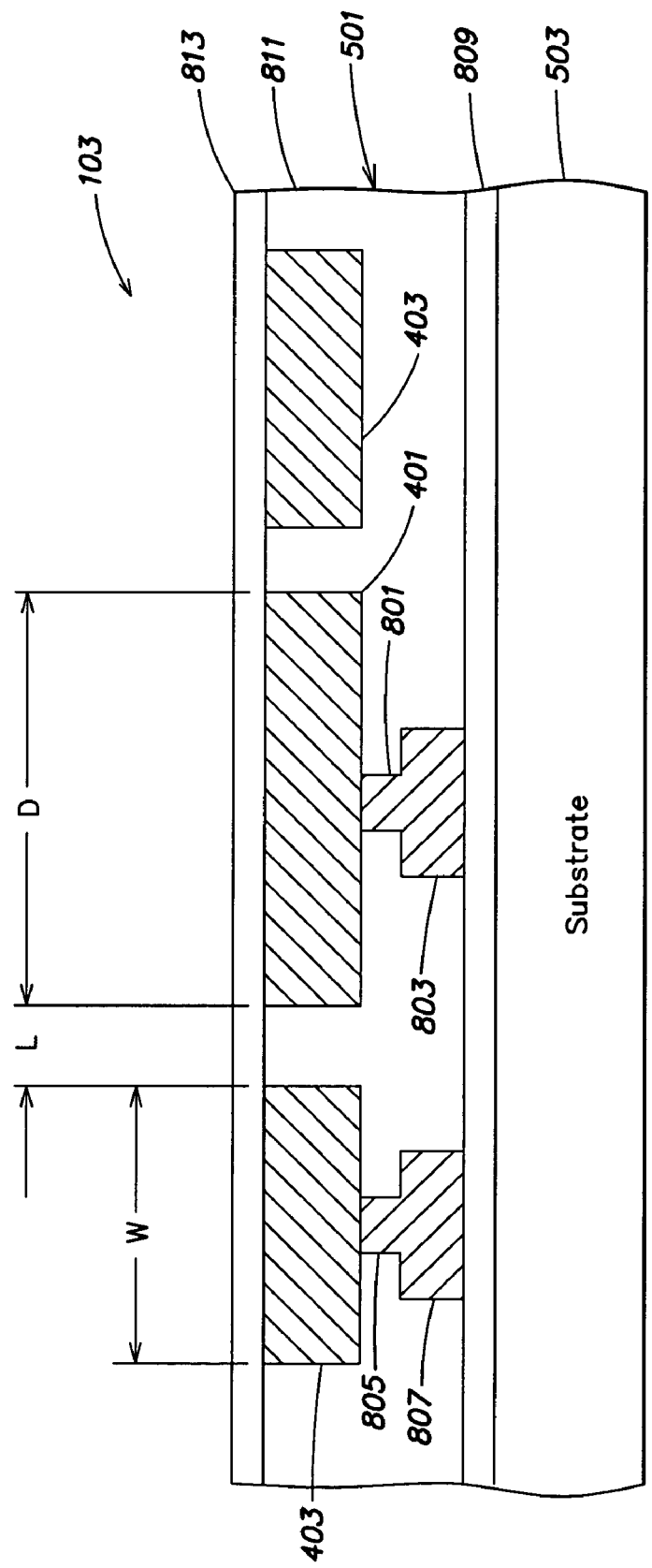
FIG. 8 illustrates an exemplary embodiment of a portion of the transfer substrate of FIG. 1 provided in accordance with the present invention.

FIG. 8 illustrates an exemplary embodiment of a portion of the transfer substrate 103 of FIG. 1 provided in accordance with the present invention. With reference to FIG. 8, the transfer substrate 103 includes inner and outer electrodes 401, 403 disposed within the dielectric layer 501. A first via 801 couples the inner electrode 401 to an underlying inner electrode trace 803; and a second via 805 couples the outer electrode 403 to an underlying outer electrode trace 807. The dielectric layer 501 includes a first, a second and a third dielectric layer 809-813, respectively.

In one exemplary embodiment of the invention, the first dielectric layer 809 has a thickness of about 3 microns, the second dielectric layer 811 has a thickness of about 3-6 microns and the third dielectric layer 813 has a thickness of about 0.5 to 10 microns. The inner electrode 401 has a diameter D of about 10 microns. The inner and outer electrodes 401, 403 are spaced by a distance L of about 2.5 microns, and the outer electrode 403 has a width W of about 5 microns. The inner and outer electrodes 401, 403, the vias 801, 805 and the traces 803, 807 have thicknesses of about 1-2 microns; and the vias 801, 805 and the traces 803, 807 have widths of about 1-2 microns. Other dimensions for the dielectric layers, electrodes, electrode spacings, vias, traces, etc., may be employed.

Figure 9:
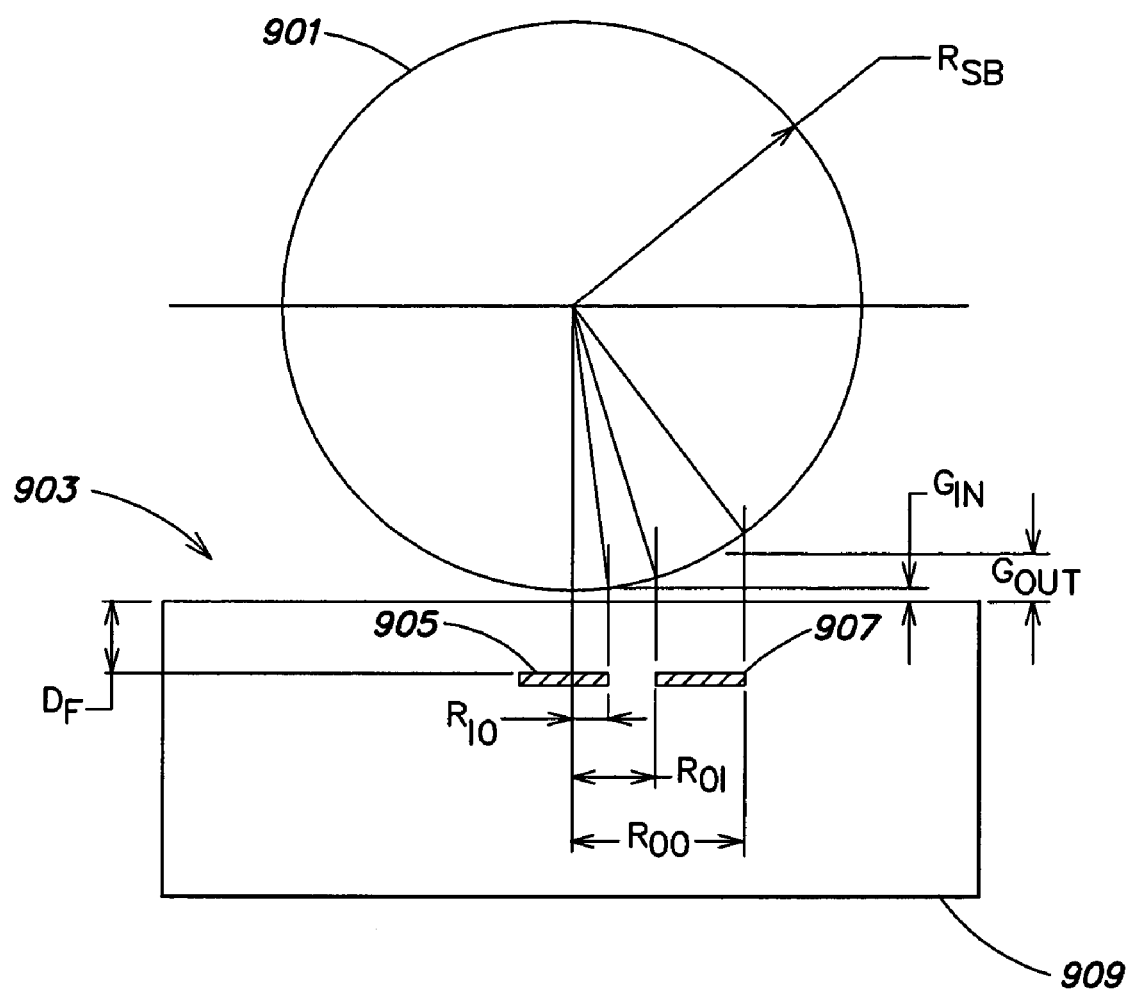
FIG. 9 illustrates an exemplary sphere on plane geometry for an electrostatic charge (ESC) calculation.

FIG. 9 illustrates an exemplary sphere on plane geometry for an electrostatic charge (ESC) calculation. With reference to FIG. 9, a sphere 901 is positioned adjacent a portion of a transfer substrate 903 (e.g., any of the inventive transfer substrates described herein). The transfer substrate 903 includes inner and outer electrodes 905, 907 disposed within a dielectric layer 909. The sphere 901 has a radius of $R_{SB}$ such that an inner air gap $G_{in}$ exists between the outer edge of the inner electrode 905 and the dielectric layer 909 and an outer air gap $G_{out}$ exists between the outer edge of the outer electrode 907 and the dielectric layer 909 (see FIG. 9). That is, the sphere 901 is separated from the inner electrode 905 by an inner airgap $G_{in}$ and from the outer electrode 907 by an outer airgap $G_{out}$. The dielectric layer thickness between the electrodes 905, 907 and the top of the dielectric layer 909 is Df. The inner electrode 905 has a radius of $R_{io}$, and the outer electrode 907 has an inner radius of $R_{oi}$ and an outer radius of $R_{oo}$.

Figure 10:
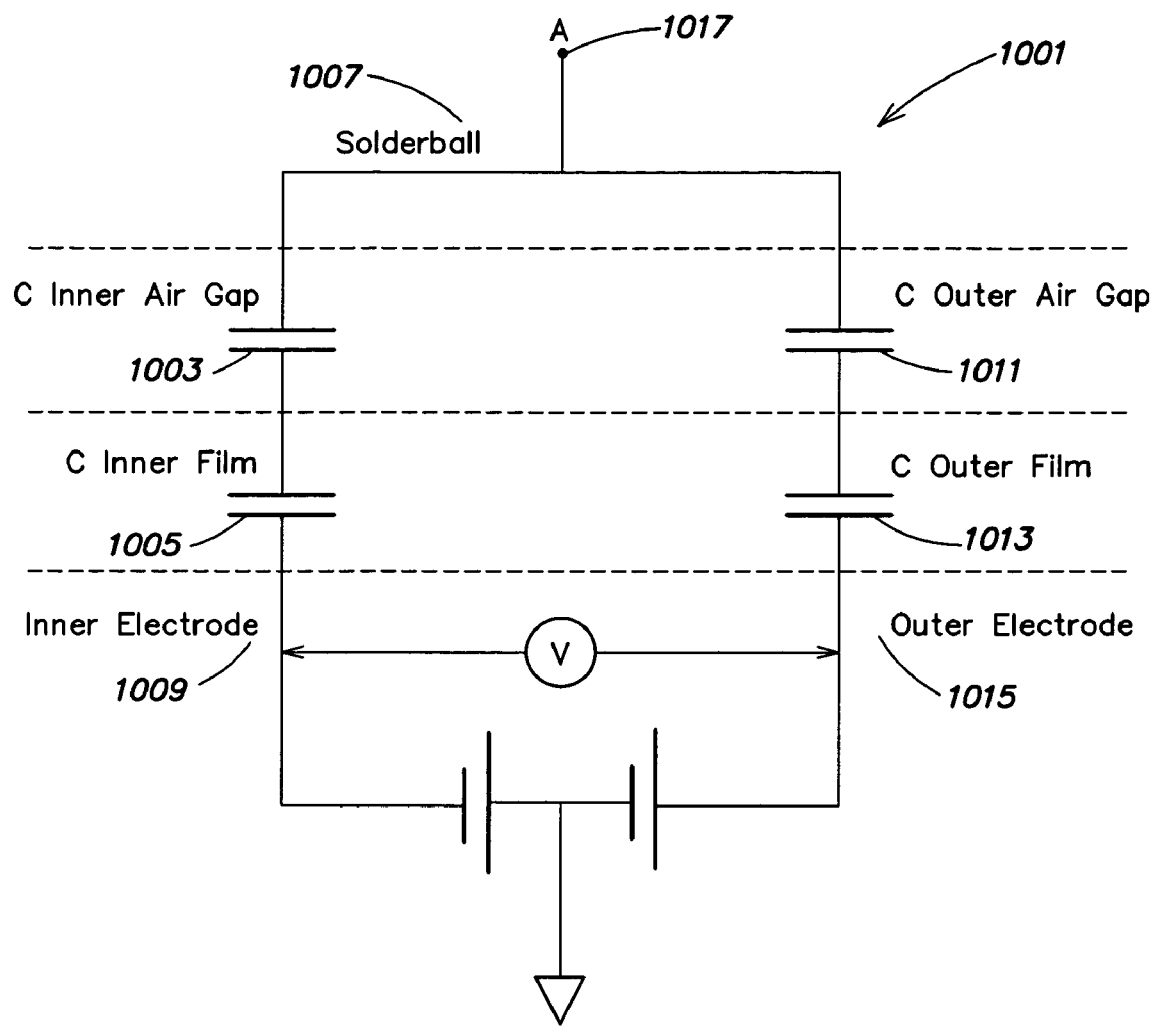
FIG. 10 illustrates an equivalent circuit for the ESC calculation of the sphere on plane geometry of FIG. 9.

FIG. 10 illustrates an exemplary equivalent circuit 1001 for the ESC calculation of the sphere on plane geometry of FIG. 9. With reference to FIG. 10, the equivalent circuit 1001 includes an inner air gap capacitance 1003 in series with an inner film capacitance 1005 between a sphere 1007 (e.g., a solderball) and an inner electrode 1009. The equivalent circuit 1001 also includes an outer air gap capacitance 1011 in series with an outer film capacitance 1013 between the sphere 1007 and an outer electrode 1015.

For a bipolar configuration, the node 1017 is floating. The total capacitance may be represented by the series combination of all four capacitors.

For a unipolar configuration, the node 1017 is grounded. The total capacitance may be represented by the parallel sum of the series combination of the air and film capacitors.

FIG. 11 is a table of an optimized bipolar electrode geometry for a third dielectric layer 813 (FIG. 8) thickness of 1 micron. FIG. 12 is a table of an optimized bipolar electrode geometry for a third dielectric layer 813 (FIG. 8) thickness of 10 microns.

With reference to FIGS. 9-12, to optimize an electrode geometry for a bipolar ESC calculation, the optimum electrode radii is calculated for various ball sizes. This value depends on, for example, ball radius (which determines inner and outer air gaps), film thickness and dielectric constant. For maximum force, inner and outer capacitances should be equal, but due to different air gaps (inner versus outer), the outer electrode area is preferably greater than the inner electrode area.

A sphere-on-plane geometry is a complex geometry due to the differing air gaps (FIG. 9). A bipolar electrode with an electrically floating ball may be represented by 4 capacitors in series. That is, the electrostatic (ES) Force equation is not the well-known parallel plate equation. Rather, the Force equation is derived from the Energy equation:

$$\text{Force} = \frac{1}{2} * V^2 * d/dx(\text{net capacitance}(x))$$

(where V is voltage). For a thin film such as one micron of $SiO_2$ driven at +/−20V with an optimum geometry, |Emax|=20 V/micron for a 15 micron radius ball and the force/weight ratio is ~360. However, for a 150 micron radius ball, the force/weight ratio drops to ~4.5 due to dominance of the air gap relative to the thin film.

For a thick film such as 10 micron $SiO_2$ driven at +/−200V with an optimum geometry, |Emax|=20V/micron for a 15 micron radius ball and the force/weight ratio is ~3000. However, for a 150 micron radius ball, the force/weight ratio drops to ~36 due to a weaker effect of the air gap relative to the thick film.

As stated, a bipolar electrode with an electrically floating ball may be represented by 4 capacitors in series. The corresponding force equation may be determined as follows:

$$\text{Force} = \frac{1}{2} \cdot V^2 \cdot \left( \frac{d}{dx} C_{total}(x) \right)$$

where:

$$C_{total} = \frac{1}{\frac{1}{C_{in}} + \frac{1}{C_{out}}}$$

and, $$C_{in} = \varepsilon_0 \cdot \frac{A_{in}}{\frac{G_{in}}{\varepsilon_{r\_air}} + \frac{D_f}{\varepsilon_{r\_film}}}$$

$$C_{out} = \varepsilon_0 \cdot \frac{A_{out}}{\frac{G_{out}}{\varepsilon_{r\_air}} + \frac{D_f}{\varepsilon_{r\_film}}}$$

Accordingly, the force equation becomes:

$$\text{Force} = \frac{1}{2} \cdot V^2 \cdot \frac{A_{in} \cdot A_{out} \cdot \varepsilon_{r\_film}^2 \cdot \varepsilon_0^3 \cdot (A_{in} + A_{out})}{\{[\varepsilon_0 \cdot D_f \cdot (A_{in} + A_{out})] + [A_{out} \cdot \varepsilon_0 \cdot (-2 \cdot D_f - G_{out})] + [A_{in} \cdot \varepsilon_0 \cdot (-2 \cdot D_f - G_{in})] + D_{total} \cdot (A_{out} \cdot \varepsilon_0 + A_{in} \cdot \varepsilon_0)\}^2}$$

wherein:

$$D_{total} = 2 \cdot D_f + G_{in} + G_{out}$$

$A_{in}$ is the inner electrode area.
$A_{out}$ is the outer electrode area.
$D_f$ is the film thickness.
$G_{in}$ is the air gap between the inner electrode and the ball.
$G_{out}$ is the air gap between the outer electrode and the ball.
$D_{total}$ is the total distance between electrodes.
$\epsilon_{r\_film}$ is the dielectric constant of the film.
$\epsilon_{r\_air}$ is the dielectric constant of the gap.
$\epsilon_0$ is the permittivity of free space.
x is the unfolded dimension from the inner electrode through the film and inner air gap to the ball through the outer air gap and film to the outer electrode.

The total attractive force between the ball and the plane is equal to the total force between the electrodes through the film and air gaps. Regarding optimization, for a given $D_f$, V, and ball size, the capacitance, and thus the force, is maximized by setting $A_{in}$ and $A_{out}$ so that $C_{in}$ is equal to $C_{out}$. As a result of the presence of air gaps (e.g., $G_{in}$ is less than $G_{out}$), $A_{out}$ must be greater than $A_{in}$.

$$\text{Optimum\_area\_ratio\_outer\_to\_inner} = \frac{\varepsilon_{r\_film} \cdot G_{out} + D_f}{\varepsilon_{r\_film} \cdot G_{in} + D_f}$$

A unipolar electrode with an electrically floating ball may be represented by a parallel and serial combination of 4 capacitors. The corresponding force equation may be determined as follows:

$$\text{Force} = \frac{1}{2} \cdot V^2 \cdot \left( \frac{d}{dx} C_{total}(x) \right)$$

where:

$$C_{total} = C_{in} + C_{out}$$

and, $$C_{in} = \varepsilon_0 \cdot \frac{A_{in}}{\frac{G_{in}}{\varepsilon_{r\_air}} + \frac{D_f}{\varepsilon_{r\_film}}}$$

$$C_{out} = \varepsilon_0 \cdot \frac{A_{out}}{\frac{G_{out}}{\varepsilon_{r\_air}} + \frac{D_f}{\varepsilon_{r\_film}}}$$

Accordingly, the force equation becomes:

$$\text{Force} = \frac{1}{2} \cdot V^2 \cdot \left[ \frac{\varepsilon_{r\_film}^2 \cdot \varepsilon_0^3 \cdot A_{in}}{(\varepsilon_0 \cdot D_f + \varepsilon_0 \cdot G_{in})^2} + \frac{\varepsilon_{r\_film}^2 \cdot \varepsilon_0^3 \cdot A_{out}}{(\varepsilon_0 \cdot D_f + \varepsilon_0 \cdot G_{out})^2} \right]$$

wherein:
$A_{in}$ is the inner electrode area.
$A_{out}$ is the outer electrode area.
$D_f$ is the film thickness.
$G_{in}$ is the air gap between the inner electrode and the ball.
$G_{out}$ is the air gap between the outer electrode and the ball.
$\epsilon_{r\_film}$ is the dielectric constant of the film.
$\epsilon_{r\_air}$ is the dielectric constant of the gap.
$\epsilon_0$ is the permittivity of free space.
x is the dimension from each electrode through the film and each air gap to the ball.
V is the unipolar voltage (½ of the bipolar voltage).

The total attractive force between the ball and the plane is equal to the sum of the forces above for the inner and outer region. Regarding optimization, $C_{in}$ and $C_{out}$ may be maximized.

The foregoing description discloses only exemplary embodiments of the invention. Modifications of the above disclosed apparatus and methods which fall within the scope of the invention will be readily apparent to those of ordinary skill in the art. For instance, the electrodes 105 of the transfer substrate 103 may be monopolar or bipolar electrodes. If the electrodes 105 are bipolar, the electrodes may be balanced or unbalanced (e.g., in terms of surface area between inner and outer electrodes and/or voltage applied thereto). The transfer substrate 103 need not be customizable. That is, the pattern and number of electrodes 105 on a transfer substrate 103 may exactly match the pattern and number of electrode pads of a target substrate. In such instances, a unique transfer substrate 103 may be required for each unique target substrate electrode pad pattern.

Numerous types of conductive pieces may be transferred using the transfer substrate 103 such as solder balls, laser diodes, non-conductive objects having a conductive or polymer layer formed on a portion thereof, etc., independent of conducting piece melting temperature, stochiometry and/or alloying, shape (assuming a suitable electrode shape is employed) or the like.

As stated, conductive pieces may be released from a bipolar electrode by applying the same polarity voltage to the inner and outer electrodes of the bipolar electrode. For example, the voltage polarity of the inner and outer electrodes may be cycled at some frequency (e.g., about 1 Hz to several hundred Hz) and/or the voltage applied thereto may be ramped down (e.g., to zero). Such a process may be performed with both monopolar and bipolar electrodes. Drive circuitry for applying voltages to inner and outer electrodes preferably is balanced with respect to ground.

In yet another embodiment of the invention, the transfer substrate 103 may employ a micro electromechanical system (MEMs) device, such as a pneumatic valve (e.g., coupled to a vacuum line), a mechanical clamp, etc., in place of one or more or all of the electrodes 105. For example, each MEMs device may be individually addressable and/or the number of MEMs devices of the transfer substrate 103 may exceed the number of electrode pads 111 of a target substrate. Such a transfer substrate thereby may be employed in a manner similar to that described above with reference to an electrode-based transfer substrate (e.g., allowing the transfer substrate to be used with multiple target substrates and/or target substrate electrode pad patterns). The target substrates described herein may be used to transfer objects to electrode pads or any other desired (target) location of a target substrate or other target location.

Accordingly, while the present invention has been disclosed in connection with exemplary embodiments thereof, it should be understood that other embodiments may fall within the spirit and scope of the invention, as defined by the following claims.

The invention claimed is:

1. A programmable transfer device for transferring conductive pieces to electrode pads of a target substrate, the programmable transfer device comprising:
   a transfer substrate; and
   a plurality of individually addressable electrodes formed on the transfer substrate, each electrode adapted to selectively attract and hold a conductive piece during transfer of the conductive pieces to the electrode pads of the target substrate.

2. The programmable transfer device of claim 1 wherein the transfer substrate comprises a silicon substrate having the plurality of electrodes formed thereon.

3. The programmable transfer device of claim 1 wherein the transfer substrate comprises a glass plate having the plurality of electrodes formed thereon.

4. The programmable transfer device of claim 1 wherein the transfer substrate has a transfer surface size that equals or is greater than a target surface size of the target substrate.

5. The programmable transfer device of claim 1 wherein at least one of the electrodes comprises a bipolar electrode.

6. The programmable transfer device of claim 1 wherein at least one of the electrodes comprises a unipolar electrode.

7. The programmable transfer device of claim 1 further comprising a controller coupled to the transfer substrate and adapted to individually address each electrode of the transfer substrate.

8. The programmable transfer device of claim 7 wherein the controller is further adapted to:
   determine an electrode pad pattern of the target substrate; and
   select corresponding electrodes of the transfer substrate to address based on the electrode pad pattern of the target substrate.

9. The programmable transfer device of claim 8 wherein the controller is further adapted to at least initiate:
   holding of the conductive pieces with the corresponding electrodes of the transfer substrate; and
   transferring the conductive pieces from the transfer substrate to the electrode pads of the target substrate.

10. A transfer device for transferring conductive pieces to target locations of a target substrate, the transfer device comprising:
    a transfer substrate; and
    a plurality of electrodes formed on the transfer substrate, each electrode adapted to selectively attract and hold a conductive piece during transfer of the conductive pieces to the target locations of the target substrate.

11. The transfer device of claim 10 wherein at least one of the electrodes comprises a bipolar electrode.

12. The transfer device of claim 10 wherein at least one of the electrodes comprises a unipolar electrode.

13. The transfer device of claim 10 wherein the target locations comprise electrode pads, and wherein each electrode is adapted to selectively attract and hold the conductive piece during transfer of the conductive pieces to the electrode pads of the target substrate.

* * * * *